United States Patent [19]
Rose

[11] Patent Number: 5,600,091
[45] Date of Patent: Feb. 4, 1997

[54] HF SHIELDED ELECTRICAL ENCLOSURES

[76] Inventor: Friedhelm Rose, Mindener Weg 24 b, 32457 Porta Westfalica, Germany

[21] Appl. No.: 258,452

[22] Filed: Jun. 10, 1994

[30] Foreign Application Priority Data

Feb. 21, 1994 [DE] Germany .................... 44 05 408.4

[51] Int. Cl.$^6$ ...................................... H05K 9/00
[52] U.S. Cl. ............................................ 174/35 R
[58] Field of Search ................. 174/35 R, 35 C, 174/35 GC; 361/816, 818; 277/227, 228, 229, 235 R, 235 A

[56] References Cited

U.S. PATENT DOCUMENTS

| | | | |
|---|---|---|---|
| 2,527,908 | 10/1950 | Blitz | 174/17.06 X |
| 3,296,356 | 1/1967 | McAdams | 174/35 GC |
| 3,738,670 | 6/1973 | Jelinek et al. | 277/199 |
| 3,885,701 | 5/1975 | Becklin | 220/325 |
| 4,980,516 | 12/1990 | Nakagawa | 174/35 GC |
| 5,008,485 | 4/1991 | Kitagawa | 174/35 GC |
| 5,076,456 | 12/1991 | Geyer | 220/4.26 |
| 5,160,806 | 11/1992 | Harada et al. | 174/35 GC |
| 5,285,007 | 2/1994 | Deluca et al. | 174/35 R |

*Primary Examiner*—Bot L. Ledynh
*Attorney, Agent, or Firm*—Carroll F. Palmer

[57] ABSTRACT

An improved HF shielding feature is provided for electrical enclosures having a box-like base and a sealing cover wherein a tongue projects integrally from the upper periphery of the base into a groove formed integrally in under periphery of the cover. The tongue has a compression surface spaced apart from the base periphery, a first outside wall depends from such tongue compression surface to an outside portion of the base periphery and a first inside wall depends from the tongue compression surface to an inside portion of the base periphery. The groove has a second compression surface spaced apart from the tongue compression surface, a second outside wall depends from the groove compression surface to an outside section of the cover periphery and a second inside wall depends from the groove compression surface to an inside section of the cover periphery. A gasket is compressed between the tongue and groove compression surfaces, the inside wall of the groove is in contact with the inside portion of the base periphery and the groove outside wall is out of contact with any of the outside portion of the base periphery.

12 Claims, 1 Drawing Sheet

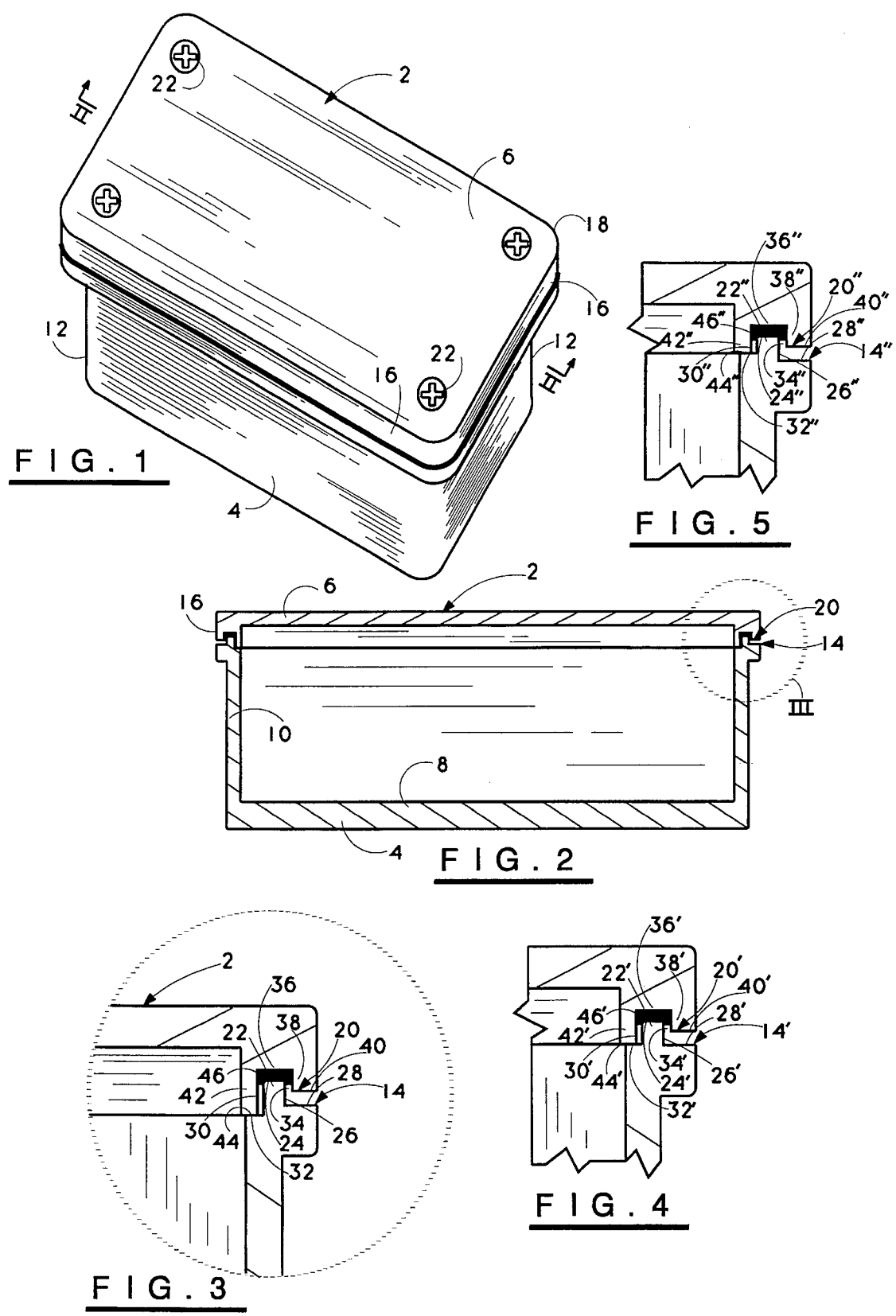

HF SHIELDED ELECTRICAL ENCLOSURES

BACKGROUND OF THE INVENTION

1. Field of the Invention

This application relates to electrical enclosures. More particularly, it concerns such HF (high frequency) shielded metal electrical enclosures for assembling with electronic components.

2. Description of the Prior Art

Electrical enclosures for assembling with electronic components typically consist of an enclosure bottom and a lid. The enclosure bottom usually is designed with 2 to 4 mounting holes for the enclosure itself outside of the enclosure interior and also has 2 to 6 threads for fastening the lid to the bottom, e.g., see U.S. Pat. No. 4,632,269, the disclosure of which is incorporated herein by reference.

The lids of these electrical enclosures have to be closed by screws or quick fasteners to make sure that no dust, humidity, oil and water can enter the enclosure interior. For this, the enclosure bottom typically has a tongue and the lid has a groove and the groove takes a gasket of rubber or plastic. After assembling, the tongue presses against the gasket to seal the enclosure lid to the bottom.

Because more and more microelectronic components are used in all kind of industrial fields there is a big risk, they will influence and disturb each other. The designer has to take care, to protect his products from being influenced by other components or against disturbing other electronic components with his own product. This interference problem is of such importance and magnitude that governmental regulations are in effect or pending relating thereto.

The manufacturers of electrical enclosures are well aware of the need for HF shielding and a variety of schemes have been developed, both for metal and plastic enclosures, for providing such articles of manufacture with HF shielding properities, e.g., see U.S. Pat. Nos. 2,317,813; 3,534,146; 4,155,478; 4,964,018; and 5,095,177.

Aluminium enclosures of standard design give some protection against HF interferences with enclosed components because of the nature of metal, but no normally used plastic material has any shielding ability. In many cases, particularly with high frequency radiations, enclosures made of aluminium metal can provide adequate HF shielding. With lower frequency radiations, HF shielding becomes a more serious problem. For example, conventional groove and tongue sealing structures have to be free of paint and expensive contacting gaskets have to be installed.

An apparent way to enhance the shielding capability of enclosures is to create paint-free contact areas, but this succeeds only when the contact areas are protected against corrosion. Otherwise, the contact areas will after a short time corrode and the HF screening effect is lost.

With prior known electrical enclosures, the contact between the lid and the bottom can be made only on the outer areas of the enclosure, i.e., only in the outer areas is the contact metal to metal, but this area is not protected against corrosion. It is also very costly, to hold this area free of paint, but the majority of elecrical enclosure users want them painted on the outside for corrosion-protection and for decorative reasons. Because of this, the use of costly contacting gaskets and paintfree tongues and grooves has been the only effective method available, but even with this solution, corrosion problems exist.

The present invention provides new improved forms of HF shielding electrical enclosures that address and mitigate the problems discussed above associated with related electrical enclosures available heretofore.

OBJECTS

A principal object of the invention is the provision of HF (high frequency) shielded metal electrical enclosures for assembling with electronic components of improved construction as compared with prior known of such type.

Further objects included the provision of:

1. New metal electrical enclosures provided with a HF shielding that enables the outside thereof to be painted without costly precautions against damage to such shielding feature.
2. Such new electrical enclosures that eliminate need for use of costly contacting gaskets and paint-free tongues and grooves.
3. Such new electrical enclosures that are effectively free of corrosion damage to the HF shielding feature.

Other objects and further scope of applicability of the present invention will become apparent from the detailed descriptions given herein; it should be understood, however, that the detailed descriptions, while indicating preferred embodiments of the invention, are given by way of illustration only, since various changes and modifications within the spirit and scope of the invention will become apparent from such descriptions.

SUMMARY OF THE INVENTION

The objects are accomplished in accordance with the invention by the provision of a improved design in electrical enclosures that have (a) a box-like base part including a bottom and a plurality of sides normal to the bottom joined at corners with the sides and corners defining a first periphery, (b) a sealing cover with sides and corners that mimic to the sides and corners of the base part defining a second periphery and (c) fasteners to attach the cover to the base part.

The invention provides such electrical enclosures with a highly effective HF shielding feature by a unique construction of the junction between the base part and sealing cover. This comprises providing the base part with a tongue projecting integrally from the first periphery normal to the bottom defined by a first compression surface spaced apart from the first periphery, a first outside wall depending from the first compression surface to an outside portion of the first periphery and a first inside wall depending from the first compression surface to an inside portion of the first periphery.

The sealing cover has a groove formed integrally in the second periphery defined by a second compression surface opposing from a predetermined distance the first compression surface, a second outside wall depending from the second compression surface to an outside section of the second periphery and a second inside wall depending from the second compression surface to an inside section of the second periphery.

A gasket is compressed between the first and the second compression surfaces and the second inside wall is at least in part in contact with the inside portion of the first periphery while the second outside wall is entirely out of contact with the outside portion of the first periphery. Hence, the second inside wall that depends from the sealing cover is in electrical contact with the inside portion of the base part and by adjusting the depth of the second inside wall and the spacing to the first and second compression surfaces, a desired compression of the gasket can be obtained. Because such contact areas are inside the enclosure behind the gasket, they are protected against corrosion.

The enclosure base part and sealing cover can be painted or powder coated while they are closed. Because of the space between the outside portion of the first periphery and the outside section of the second periphery, the base part and the sealing cover will not bake together and the interior of the enclosure will be free of paint. Hence, the new electrical enclosures of the invention attain cost saving and quality advantage.

Excellent electrical contact between the base part and the cover is provided by the construction of the invention without need to install costly contacting gaskets. To improve further the contacting between base part and cover, the second inside wall may be provided with special contact points instead of a flat contact surface.

In preferred embodiments, a rim may be provided adjacent the junction between the base part and the cover which can serve as a holding frame for installing the new enclosures in switchboards or cabinet doors.

BRIEF DESCRIPTION OF THE DRAWINGS

A more complete understanding of the invention can be obtained by reference to the accompanying drawings in which:

FIG. 1 is an isometric view of a HF shielded metal electrical enclosure constructed in accordance with the invention.

FIG. 2 is a lateral, cross-sectional view taken on the line II—II of FIG. 1.

FIG. 3 is an enlarged view of the new shielding feature of the invention shown as the area designated by the circle III on FIG. 2.

FIG. 4 is an enlarged view of a second embodiment of the shielding feature of the invention.

FIG. 5 is an enlarged view of a third embodiment of the shielding feature of the invention.

DESCRIPTION OF THE PREFERRED EMBODIMENTS

The electrical enclosure 2 of the invention comprises a box-like base part 4 and a sealing cover 6.

The part 4 includes a bottom 8 and a plurality of sides 10 normal to said bottom 8 joined at corners 12 that define a first periphery 14.

The sides 16 and corners 18 of the cover 6 mimic the sides 10 and corners 12 of the base pan 4 and define a second periphery 20.

Fasteners 22 attach the cover 6 m the base part 4.

The improved HF shielding feature of the invention shown in FIG. 3 comprises a tongue 22 projecting integrally from the periphery 14 normal to bottom 8 and is defined by a first compression surface 24, a first outside wall 26 depending to outside portion 28 of periphery 14 and a first inside wall 30 depending to inside portion 32 of periphery 14.

A groove 34 is formed integrally in periphery 20 and is defined by a second compression surface 36, separated a predetermined distance from compression surface 24, a second outside wall 38 depending from compression surface 36 to an outside section 40 of periphery 20 and a second inside wall 42 longer in length than outside wall 38 depending from compression surface 36 to an inside section 44 of periphery 20.

A gasket 46 is compressed between compression surface 24 and compression surface 36 while inside wall 42 is in contact with inside portion 32 of periphery 14 and outside wall 38 is entirely out of contact with outside portion 28 of periphery 14.

The second embodiment of improved HF shielding feature of the invention shown in FIG. 4 comprises a tongue 22' projecting integrally from the periphery 14' is defined by a first compression surface 24', a first outside wall 26', depending to outside portion 28' of periphery 14' and a first inside wall 30' depending to inside portion 32' of periphery 14'.

A groove 34' is formed integrally in periphery 20' and is defined by a second compression surface 36', separated a predetermined distance from compression surface 24', a second outside wall 38' depending from compression surface 36' to an outside section 40' of periphery 20' and a second inside wall 42' depending from compression surface 36' to an inside section 44' of periphery 20'.

A gasket 46 is compressed between compression surface 24' and compression surface 36' while inside wall 42' is in contact with inside portion 32' of periphery 14' and outside wall 38' is entirely out of contact with outside portion 28' of periphery 14'.

The third embodiment of improved HF shielding feature of the invention shown in FIG. 5 comprises a tongue 22" projecting integrally from the periphery 14" normal to bottom 8 and is defined by a first compression surface 24", a first outside wall 26" depending to outside portion 28" of periphery 14" and a first inside wall 30" depending to inside portion 32" of periphery 14".

A groove 34" is formed integrally in periphery 20" and is defined by a second compression surface 36", separated a predetermined distance from compression surface 24", a second outside wall 38" depending from compression surface 36" to an outside section 40" of periphery 20" and a second inside wall 42" depending from compression surface 36" to an inside section 44" of periphery 20".

A gasket 46 is compressed between compression surface 24" and compression surface 36" while inside wall 42" is in contact with inside portion 32" of periphery 14" and outside wall 38" is entirely out of contact with outside portion 28" of periphery 14".

The embodiments of the invention in which an exclusive property or privilege is claimed are defined as follows:

1. In an electrical enclosure having a box-like base including a bottom and a plurality of base sides normal to said bottom and integrally joined by corners, said base sides and corners defining a base periphery, a sealing cover with cover sides and corners that mimic said base sides and corners defining a cover periphery and fasteners to attach said cover to said base, an improved HF shielding feature which comprises:

a tongue projecting integrally from said base periphery normal to said bottom defined by
a first compression surface spaced apart from said base periphery,
a first outside wall depending from said first compression surface to an outside portion of said base periphery and
a first inside wall depending from said first compression surface to an inside portion of said base periphery, a groove formed integrally in said cover periphery defined by
a second compression surface opposing from a predetermined distance said first compression surface,
a second outside wall depending from said second compression surface to an outside section of said cover periphery and
a second inside wall depending from said second compression surface to an inside section of said cover periphery, and a gasket compressed between said first compression surface and said second compression surface, said at least a part of second inside wall is in contact with at least some of said inside portion of said base periphery and all of said second outside wall is out of contact with said outside portion of said base periphery.

2. The electrical enclosure of claim 1 wherein said plurality is four.

3. The electrical enclosure of claim 1 wherein said first inside wall is longer in length than said first outside wall.

4. The electrical enclosure of claim 1 wherein said second inside wall is longer in length than said second outside wall.

5. The electrical enclosure of claim 1 wherein said first compression surface is flat.

6. The electrical enclosure of claim 1 wherein said second compression surface is flat.

7. The electrical enclosure of claim 5 wherein said second compression surface is flat.

8. The electrical enclosure of claim 1 wherein said outside and inside portions of said first periphery are flat.

9. The electrical enclosure of claim 1 wherein said outside and inside sections of said second periphery are flat.

10. The electrical enclosure of claim 1 wherein said second inside wall includes projections for contact with said inside portion of said first periphery.

11. In an electrical enclosure having a box-like base including a bottom and a plurality of base sides normal to said bottom and integrally joined by corners, said base sides and corners defining a base periphery, a sealing cover with cover sides and corners that mimic said base sides and corners defining a cover periphery and fasteners to attach said cover to said base, an improved HF shielding feature which comprises:

a tongue projecting integrally from said base periphery normal to said bottom defined by
a first compression surface spaced apart from said base periphery,
a first outside wall depending from said first compression surface to an outside portion of said base periphery and
a first inside wall longer in length than said first outside wall depending from said first compression surface to an inside portion of said base periphery, a groove formed integrally in said cover periphery defined by
a second compression surface opposing from a predetermined distance said first compression surface,
a second outside wall depending from said second compression surface to an outside section of said cover periphery and
a second inside wall longer in length than said second outside wall depending from said second compression surface to an inside section of said cover periphery, and a gasket compressed between said first compression surface and said second compression surface, said second inside wall is at least in part in contact with said inside portion of said base periphery and said second outside wall is entirely out of contact with said outside portion of said base periphery.

12. In an electrical enclosure having a box-like base including a bottom and a plurality of base sides normal to said bottom and integrally joined by corners, the top ends of said base sides and corners defining a base periphery, a sealing cover with cover sides and corners that mimic said base defining a cover periphery and fasteners to attach said cover to said base, an improved HF shielding feature which comprises:

a tongue projecting vertically from said base periphery defined by
a top surface spaced apart from said base periphery,
a tongue outside wall that depends to an outside portion of said base periphery and
a tongue inside wall that depends to an inside portion of said base periphery, a groove formed integrally in said cover periphery defined by
a compression surface opposing from a predetermined distance said top surface,
a groove outside wall depending from said compression surface to an outside section of said cover periphery, and
a groove inside wall depending from said compression surface to an inside section of said cover periphery, and a gasket compressed between said top surface and said compression surface, at least part of said groove inside wall being in contact with at least part of said inside portion of said base periphery and all of said groove outside wall being out of contact with said outside portion of said base periphery, said contact providing the only electrical connection between said base and said cover.

* * * * *